(12) United States Patent
Yamashita et al.

(10) Patent No.: US 9,142,573 B1
(45) Date of Patent: Sep. 22, 2015

(54) THIN FILM TRANSISTOR SUBSTRATE AND METHOD FOR PRODUCING SAME

(75) Inventors: Tetsuya Yamashita, Osaka (JP); Tokuo Yoshida, Osaka (JP); Yoshimasa Chikama, Osaka (JP); Yoshifumi Ohta, Osaka (JP); Yuuji Mizuno, Osaka (JP); Hinae Mizuno, legal representative, Yamato (JP); Masahiko Suzuki, Osaka (JP); Okifumi Nakagawa, Osaka (JP); Yoshiyuki Harumoto, Osaka (JP); Yoshinobu Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 548 days.

(21) Appl. No.: 13/699,377

(22) PCT Filed: Feb. 14, 2011

(86) PCT No.: PCT/JP2011/000800
§ 371 (c)(1),
(2), (4) Date: Nov. 28, 2012

(87) PCT Pub. No.: WO2011/148537
PCT Pub. Date: Dec. 1, 2011

(30) Foreign Application Priority Data

May 24, 2010 (JP) .................................. 2010-117986

(51) Int. Cl.
*H01L 21/00* (2006.01)
*H01L 27/12* (2006.01)

(52) U.S. Cl.
CPC ............ *H01L 27/127* (2013.01); *H01L 27/124* (2013.01); *H01L 27/1225* (2013.01); *H01L 27/1255* (2013.01); *H01L 27/1262* (2013.01)

(58) Field of Classification Search
None
See application file for complete search history.

(56) References Cited

U.S. PATENT DOCUMENTS

| | | | |
|---|---|---|---|
| 6,218,219 B1 | 4/2001 | Yamazaki et al. | |
| 6,255,130 B1 | 7/2001 | Kim | |
| 2010/0044701 A1 | 2/2010 | Sano et al. | |
| 2010/0109004 A1 | 5/2010 | Arai | |
| 2011/0024751 A1 | 2/2011 | Yamazaki et al. | |
| 2011/0057918 A1 | 3/2011 | Kimura et al. | |
| 2012/0218485 A1* | 8/2012 | Chikama et al. | 349/39 |

FOREIGN PATENT DOCUMENTS

| | | |
|---|---|---|
| JP | 11-103066 A | 4/1999 |
| JP | 3756363 B2 | 3/2006 |
| JP | 2008-065225 A | 3/2008 |
| JP | 2008-108985 A | 5/2008 |
| JP | 2008-235871 A | 10/2008 |

(Continued)

OTHER PUBLICATIONS

Official Communication issued in International Patent Application No. PCT/JP2011/000800, mailed on May 10, 2011.

*Primary Examiner* — Kyoung Lee
(74) *Attorney, Agent, or Firm* — Keating & Bennett, LLP (57) ABSTRACT

Each of the auxiliary capacitors (6a) includes a capacitor line (11b) comprised of the same material as the gate electrode (11a) and provided in the same layer as the gate electrode (11a), the gate insulating film (12) provided so as to cover the capacitor line (11a), a capacitor intermediate layer (13c) provided using the oxide semiconductor and provided on the gate insulating film (12) so as to overlap the capacitor line (11b), and a capacitor electrode (15b) provided on the capacitor intermediate layer (13c), and the capacitor intermediate layer (13c) is conductive.

6 Claims, 8 Drawing Sheets

(56) References Cited

FOREIGN PATENT DOCUMENTS

| JP | 2009-099847 A | 5/2009 |
| JP | 2010-114213 A | 5/2010 |
| JP | 2011-049539 A | 3/2011 |
| JP | 2011-076079 A | 4/2011 |
| JP | 2011-100994 A | 5/2011 |
| JP | 2011-100995 A | 5/2011 |

* cited by examiner

THIN FILM TRANSISTOR SUBSTRATE AND METHOD FOR PRODUCING SAME

TECHNICAL FIELD

The present invention relates to thin film transistor substrates and manufacturing methods thereof, and more particularly to thin film transistor substrates having auxiliary capacitors and manufacturing methods thereof.

BACKGROUND ART

Active matrix liquid crystal display panels include a TFT substrate having, e.g., a thin film transistor (hereinafter also referred to as the "TFT") provided as a switching element in each pixel as a minimum unit of an image, a counter substrate placed so as to face the TFT substrate, and a liquid crystal layer enclosed between the substrates. In this TFT substrate, an auxiliary capacitor is provided in each pixel in order to stably retain charge of the liquid crystal layer in each pixel, namely a liquid crystal capacitor.

For example, Patent Document 1 discloses a method for manufacturing a TFT substrate having storage capacitors (corresponding to the auxiliary capacitors) by using four masks. Each storage capacitor is formed by: a stacked pattern of a semiconductor pattern comprised of a semiconductor such as amorphous silicon, a contact layer pattern comprised of amorphous silicon heavily doped with N-type impurities such as phosphorus, etc., and a storage capacitor conductive pattern comprised of a conductive substance such as Mo or a MoW alloy, Cr, Al or an Al alloy, or Ta; a storage electrode provided so as to be located below the stacked pattern, and comprised of a conductive substance such as Mo or a MoW alloy, Cr, Al or an Al alloy, or Ta; and a gate insulating film provided between the stacked pattern and the storage electrode.

CITATION LIST

Patent Document

PATENT DOCUMENT 1: Japanese Patent No. 3756363

SUMMARY OF THE INVENTION

Technical Problem

However, as disclosed in Patent Document 1, if a semiconductor layer is stacked on one of a pair of electrodes of each auxiliary capacitor in the TFT substrate having the auxiliary capacitors, electric capacitance of the auxiliary capacitor is varied by a voltage that is applied between the pair of electrodes. This decreases display quality of liquid crystal display panels including such a TFT substrate.

The present invention was developed in view of the above problem, and it is an object of the present invention to suppress variation in electric capacitance of an auxiliary capacitor due to semiconductor.

Solution to the Problem

In order to achieve the above object, according to the present invention, a capacitor intermediate layer provided using an oxide semiconductor is made conductive.

Specifically, a thin film transistor substrate according to the present invention includes: a plurality of pixel electrodes arranged in a matrix pattern; a plurality of thin film transistors respectively provided for the pixels electrodes and respectively connected to the pixel electrodes; and a plurality of auxiliary capacitors respectively provided for the pixel electrodes, wherein each of the thin film transistors includes a gate electrode provided on a substrate, a gate insulating film provided so as to cover the gate electrode, a semiconductor layer comprised of an oxide semiconductor and having a channel region provided on the gate insulating film so as to overlap the gate electrode, and a source electrode and a drain electrode which are provided on the semiconductor layer so as to be separated from each other with the channel region interposed therebetween, each of the auxiliary capacitors includes a capacitor line comprised of a same material as the gate electrode and provided in a same layer as the gate electrode, the gate insulating film provided so as to cover the capacitor line, a capacitor intermediate layer provided using the oxide semiconductor and provided on the gate insulating film so as to overlap the capacitor line, and a capacitor electrode provided on the capacitor intermediate layer, and the capacitor intermediate layer is conductive.

According to the above configuration, in each of the auxiliary capacitors, the capacitor intermediate layer provided in the same layer as the semiconductor layer comprised of an oxide semiconductor and forming the thin film transistor has a conductive property rather than a semiconductor property, the gate insulating film is the only dielectric material that retains charge when a voltage is applied between the capacitor line and the capacitor electrode. Thus, electric capacitance is stabilized ($1/C_{auxiliary\ capacitor} = 1/C_{gate\ insulating\ film}$). On the other hand, in the case where the capacitor intermediate layer is comprised of an oxide semiconductor and thus has a semiconductor property, the gate insulating film and the capacitor intermediate layer having a semiconductor property are the dielectric material that retains charge when a voltage is applied between the capacitor line and the capacitor electrode. Thus, the electric capacitance becomes unstable ($1/C_{auxiliary\ capacitor} = 1/C_{oxide\ semiconductor} + 1/C_{gate\ insulating\ film}$). Since the capacitor intermediate layer is provided by using an oxide semiconductor, but is conductive, variation in electric capacitance of the auxiliary capacitor due to the semiconductor can be suppressed. Moreover, the gate insulating film is the only dielectric material that retains charge when a voltage is applied between the capacitor line and the capacitor electrode. Thus, not only the electric capacitance of the auxiliary capacitor is stabilized, but also the electric capacitance of the auxiliary capacitor is increased.

The capacitor electrode may be a part of the drain electrode.

According to the above configuration, since the capacitor electrode is a part of the drain electrode, the auxiliary capacitor is specifically formed by the stacked structure of the capacitor line, the gate insulating film, the capacitor intermediate layer, and the drain electrode.

A productive film may be provided on the semiconductor layer so as to cover at least the channel region, and the capacitor intermediate layer may be exposed from the protective layer.

According to the above configuration, the protective film is provided on the channel region of the semiconductor layer, and the capacitor intermediate layer is exposed from the protective layer. Thus, even if, e.g., vacuum annealing is performed on the substrate to make the capacitor intermediate layer provided using an oxide semiconductor conductive, the channel region of the semiconductor layer is not made conductive, and the semiconductor property of the channel region is maintained.

The capacitor electrode may be a part of the pixel electrode.

According to the above configuration, since the capacitor electrode is a part of the pixel electrode, the auxiliary capacitor is specifically formed by the stacked structure of the capacitor line, the gate insulating film, the capacitor intermediate layer, and the pixel electrode.

An interlayer insulating film may be provided on each of the thin film transistors, and the capacitor intermediate layer may be exposed from the interlayer insulating film.

According to the above configuration, the interlayer insulating film is provided on each of the thin film transistors, and the capacitor intermediate layer is exposed from the interlayer insulating film. Thus, even if, e.g., vacuum annealing is performed on the substrate to make the capacitor intermediate layer provided using an oxide semiconductor conductive, the semiconductor layer forming the thin film transistor is not made conductive, and the semiconductor property of the semiconductor layer can be maintained.

A method for manufacturing a thin film transistor substrate according to the present invention is a method for manufacturing a thin film transistor substrate including a plurality of pixel electrodes arranged in a matrix pattern, a plurality of thin film transistors respectively provided for the pixels electrodes and respectively connected to the pixel electrodes, and a plurality of auxiliary capacitors respectively provided for the pixel electrodes, wherein each of the thin film transistors includes a gate electrode provided on a substrate, a gate insulating film provided so as to cover the gate electrode, a semiconductor layer comprised of an oxide semiconductor and having a channel region provided on the gate insulating film so as to overlap the gate electrode, and a source electrode and a drain electrode which are provided on the semiconductor layer so as to be separated from each other with the channel region interposed therebetween, each of the auxiliary capacitors includes a capacitor line comprised of a same material as the gate electrode and provided in a same layer as the gate electrode, the gate insulating film provided so as to cover the capacitor line, a capacitor intermediate layer provided using the oxide semiconductor and provided on the gate insulating film so as to overlap the capacitor line, and a capacitor electrode provided on the capacitor intermediate layer, the method including: a first step of forming the gate electrode and the capacitor line on the substrate; a second step of forming the gate insulating film so as to cover the gate electrode and the capacitor line, and then forming on the gate insulating film the semiconductor layer and another semiconductor layer that serves as the capacitor intermediate layer; a third step of forming a protective layer so as to overlap the channel region and to expose the another semiconductor layer, and then making the another semiconductor layer exposed from the protective film conductive by vacuum annealing, thereby forming the capacitor intermediate layer; a fourth step of forming on the semiconductor layer the source electrode and the drain electrode that functions as the capacitor electrode; a fifth step of forming on the source electrode and the drain electrode an interlayer insulating film having a contact hole extending to the drain electrode; and a sixth step of forming the pixel electrode on the interlayer insulating film.

According to the above method, in the second step, both the semiconductor layer, which is comprised of an oxide semiconductor and has the channel region provided so as to overlap the gate electrode, and the another semiconductor layer, which is provided so as to overlap the capacitor line and will serve as the capacitor intermediate layer, are formed on the gate insulating film. Then, in the third step, the another semiconductor layer exposed from the protective film overlapping the channel region is made conductive by vacuum annealing, thereby forming the capacitor intermediate layer from the another semiconductor layer while maintaining the semiconductor property of the semiconductor layer. Thus, in each auxiliary capacitor formed by the stacked structure of the capacitor line, the gate insulating film, the capacitor intermediate layer, and the drain electrode, the capacitor intermediate layer provided in the same layer as the semiconductor layer comprised of an oxide semiconductor and forming the thin film transistor has a conductive property rather than a semiconductor property. Accordingly, the gate insulating film is the only dielectric material that retains charge when a voltage is applied between the capacitor line and the capacitor electrode (the drain electrode). Thus, electric capacitance is stabilized ($1/C_{auxiliary\ capacitor} = 1/C_{gate\ insulating\ film}$). On the other hand, in the case where the capacitor intermediate layer is comprised of an oxide semiconductor and thus has a semiconductor property, the gate insulating film and the capacitor intermediate layer having a semiconductor property are the dielectric material that retains charge when a voltage is applied between the capacitor line and the capacitor electrode. Thus, the electric capacitance becomes unstable ($1/C_{auxiliary\ capacitor} = 1/C_{oxide\ semiconductor} + 1/C_{gate\ insulating\ film}$). Since the capacitor intermediate layer is provided using an oxide semiconductor, but is conductive, variation in electric capacitance of the auxiliary capacitor due to the semiconductor can be suppressed. Moreover, the gate insulating film is the only dielectric material that retains charge when a voltage is applied between the capacitor line and the capacitor electrode (the drain electrode). Thus, not only the electric capacitance of the auxiliary capacitor is stabilized, but also the electric capacitance of the auxiliary capacitor is increased.

A method for manufacturing a thin film transistor substrate according to the present invention is a method for manufacturing a thin film transistor substrate including a plurality of pixel electrodes arranged in a matrix pattern, a plurality of thin film transistors respectively provided for the pixels electrodes and respectively connected to the pixel electrodes, and a plurality of auxiliary capacitors respectively provided for the pixel electrodes, wherein each of the thin film transistors includes a gate electrode provided on a substrate, a gate insulating film provided so as to cover the gate electrode, a semiconductor layer comprised of an oxide semiconductor and having a channel region provided on the gate insulating film so as to overlap the gate electrode, and a source electrode and a drain electrode which are provided on the semiconductor layer so as to be separated from each other with the channel region interposed therebetween, each of the auxiliary capacitors includes a capacitor line comprised of a same material as the gate electrode and provided in a same layer as the gate electrode, the gate insulating film provided so as to cover the capacitor line, a capacitor intermediate layer provided using the oxide semiconductor and provided on the gate insulating film so as to overlap the capacitor line, and a capacitor electrode provided on the capacitor intermediate layer, the method including: a first step of forming the gate electrode and the capacitor line on the substrate; a second step of sequentially forming the gate insulating film, an oxide semiconductor film, and a source metal film so as to cover the gate electrode and the capacitor line, then forming on the source metal film a resist pattern in which a portion corresponding to the source electrode and the drain electrode is relatively thick and a portion corresponding to the channel region and the capacitor intermediate layer is relatively thin, and subsequently, etching the source metal film exposed from the resist pattern and the oxide semiconductor film, and then thinning the resist pattern to remove the relatively thin portion, and etching the source metal film thus exposed, thereby forming the semiconductor layer, the source electrode and the drain electrode, and another semiconductor layer that serves as the capacitor intermediate layer; a third step of forming an interlayer insulating film so as to overlap the channel region of the semiconductor layer and to expose a part of the drain electrode and the another semiconductor layer, and then making the another semiconductor layer exposed from the interlayer insulating film conductive by vacuum annealing, thereby forming the capacitor intermediate layer; and a fourth step of forming on the interlayer insulating film the pixel electrode that functions as the capacitor electrode.

According to the above method, in the second step, both the semiconductor layer, which is comprised of an oxide semiconductor and has the channel region C provided so as to overlap the gate electrode, and the another semiconductor layer, which is provided so as to overlap the capacitor line and will serve as the capacitor intermediate layer, are formed on the gate insulating film. Then, in the third step, the another semiconductor layer exposed from the interlayer insulating film overlapping the channel region is made conductive by vacuum annealing, thereby forming the capacitor intermediate layer from the another semiconductor layer while maintaining the semiconductor property of the semiconductor layer. Thus, in each auxiliary capacitor formed by the stacked structure of the capacitor line, the gate insulating film, the capacitor intermediate layer, and the pixel electrode, the capacitor intermediate layer provided in the same layer as the semiconductor layer comprised of an oxide semiconductor and forming the thin film transistor has a conductive property rather than a semiconductor property. Accordingly, the gate insulating film is the only dielectric material that retains charge when a voltage is applied between the capacitor line and the capacitor electrode. Thus, electric capacitance is stabilized ($1/C_{auxiliary\ capacitor} = 1/C_{gate\ insulating\ film}$). On the other hand, in the case where the capacitor intermediate layer is comprised of an oxide semiconductor and thus has a semiconductor property, the gate insulating film and the capacitor intermediate layer having a semiconductor property are the dielectric material that retains charge when a voltage is applied between the capacitor line and the capacitor electrode. Thus, the electric capacitance becomes unstable ($1/C_{auxiliary\ capacitor} = 1/C_{oxide\ semiconductor} + 1/C_{gate\ insulating\ film}$). Since the capacitor intermediate layer is provided using an oxide semiconductor, but is conductive, variation in electric capacitance of the auxiliary capacitor due to the semiconductor can be suppressed. Moreover, the gate insulating film is the only dielectric material that retains charge when a voltage is applied between the capacitor line and the capacitor electrode. Thus, not only the electric capacitance of the auxiliary capacitor is stabilized, but also the electric capacitance of the auxiliary capacitor is increased. Moreover, the thin film transistor substrate is manufactured by using a total of four photomasks, namely a photomask used in the first step, a photomask (capable of providing halftone exposure) used in the second step, a photomask used in the third step, and a photomask used in the fourth step, manufacturing cost of the thin film transistor substrate is reduced.

Advantages of the Invention

According to the present invention, since the capacitor intermediate layer provided using an oxide semiconductor is conductive, variation in electric capacitance of the auxiliary capacitor due to the semiconductor can be suppressed.

DESCRIPTION OF EMBODIMENTS

Embodiments of the present invention will be described in detail below with reference to the accompanying drawings. The present invention is not limited to the following embodiments.

First Embodiment of Invention

Figure 1:
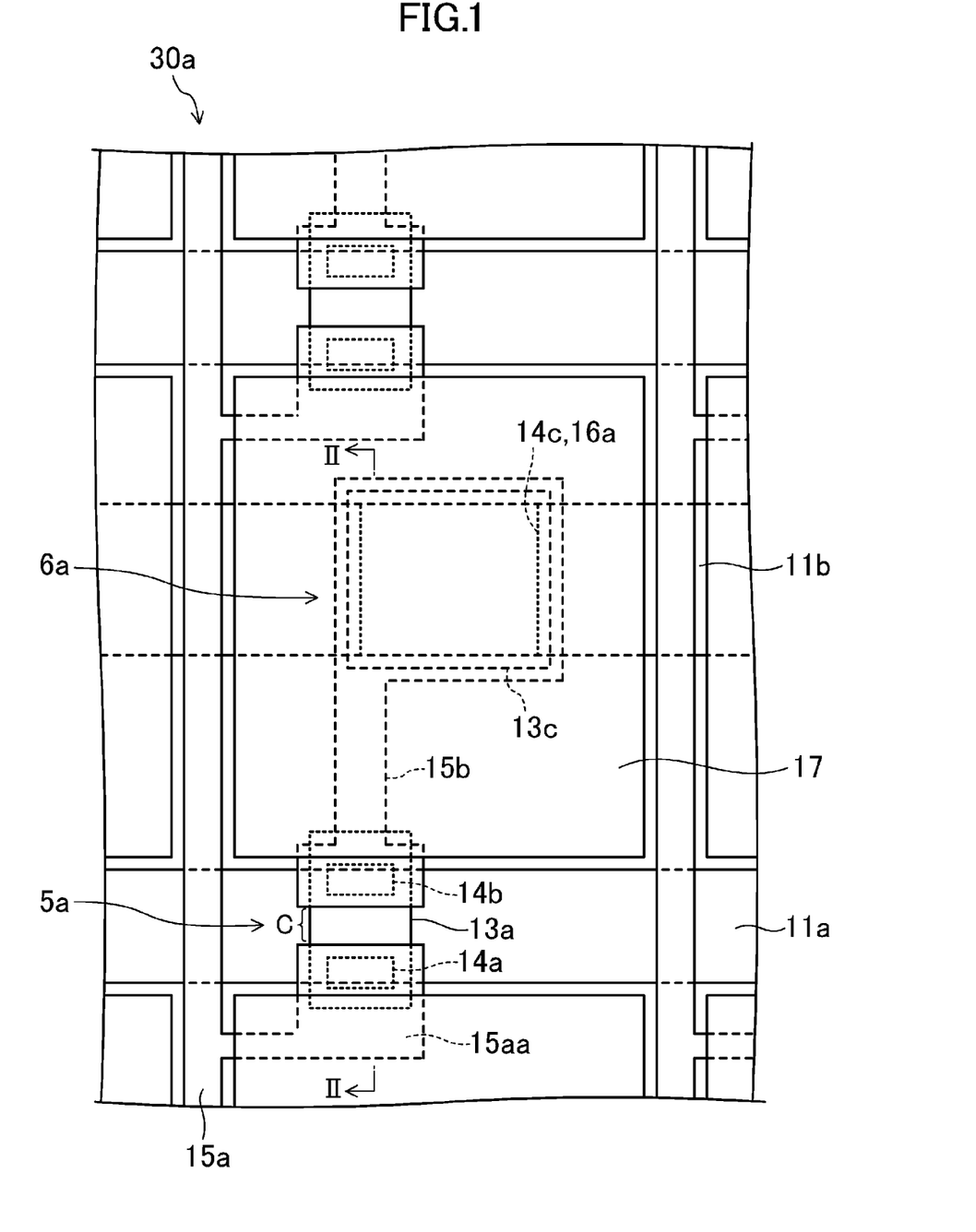
FIG. 1 is a plan view of a TFT substrate according to a first embodiment.
Figure 2:
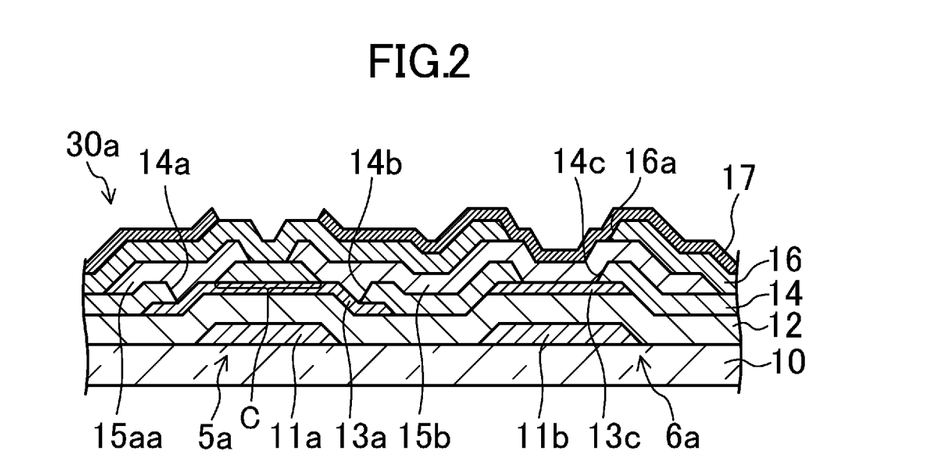
FIG. 2 is a cross-sectional view of the TFT substrate taken along line II-II in FIG. 1.
Figure 3:
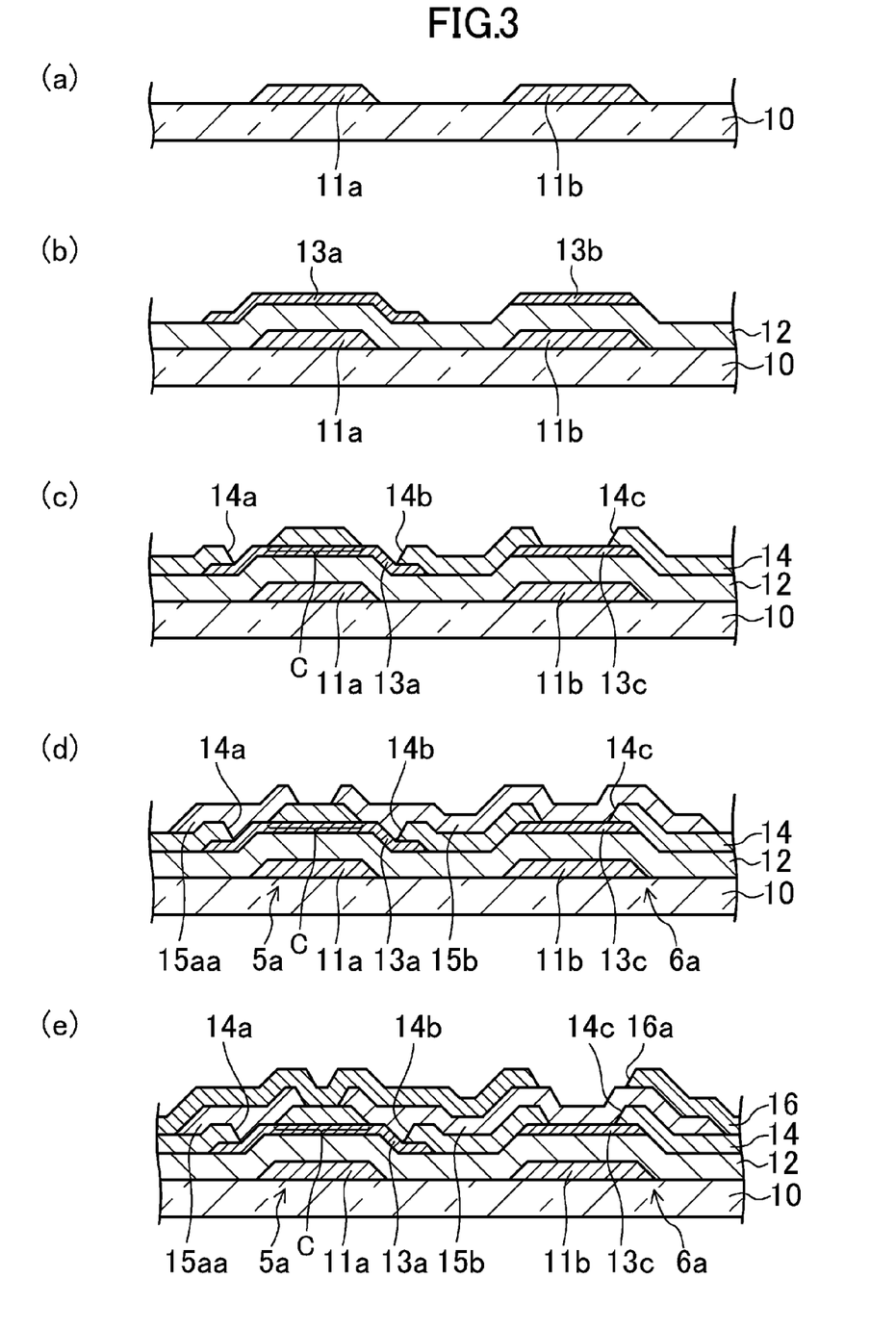
FIGS. 3A-3E are diagrams illustrating in cross section a manufacturing process of the TFT substrate according to the first embodiment.

FIGS. 1-7 show a first embodiment of a TFT substrate and a manufacturing method thereof according to the present invention. Specifically, FIG. 1 is a plan view of a TFT substrate 30a of the present embodiment, and FIG. 2 is a cross-sectional view of the TFT substrate 30a taken along line II-II in FIG. 1.

As shown in FIGS. 1-2, the TFT substrate 30a includes: an insulating substrate 10; a plurality of gate lines 11a provided on the insulating substrate 10 so as to extend parallel to each other; a plurality of capacitor lines 11b each provided between adjoining ones of the gate lines 11a and arranged so as to extend parallel to each other; a plurality of source lines 15a provided so as to extend parallel to each other in a direction perpendicular to the gate lines 11a; a plurality of TFTs 5a provided at every intersection of the gate line 11a and the source line 15a, i.e., in every pixel as a minimum unit of an image; an interlayer insulating film 16 provided so as to cover the TFTs 5a; a plurality of pixel electrodes 17 provided in a matrix pattern on the interlayer insulating film 16; and an alignment film (not shown) provided so as to cover the pixel electrodes 17.

As shown in FIGS. 1-2, the TFT 5a includes a gate electrode (11a) provided on the insulating substrate 10, a gate insolating film 12 provided so as to cover the gate electrode (11a), a semiconductor layer 13a provided on the gate insulating film 12 and having a channel region C placed therein so as to overlap the gate electrode (11a), a protective film 14 provided so as to cover at least the channel region C of the semiconductor layer 13a, and a source electrode 15aa and a drain electrode 15b which are provided on the semiconductor layer 13a and placed so as to be separated from each other with the channel region C interposed therebetween.

As shown in FIG. 1, the gate electrode (11a) is a part of the gate line 11a.

As shown in FIG. 1, the source electrode 15aa is a portion of the source line 15a which protrudes in the lateral direction so as to form an L-shape. As shown in FIGS. 1-2, the source electrode 15aa is connected to the semiconductor layer 13a via a contact hole 14a formed in the protective layer 14.

As shown in FIGS. 1-2, the drain electrode 15b is connected to the pixel electrode 17 via a contact hole 16a formed in the interlayer insulating film 16, and is connected to the semiconductor layer 13a via a contact hole 14b formed in the protective layer 14. As shown in FIGS. 1-2, the drain electrode 15b overlaps the capacitor line 11b with both the gate insulating film 12 and a capacitor intermediate layer 13c interposed therebetween, thereby forming an auxiliary capacitor 6a.

The semiconductor layer 13a is comprised of an In—Ga—Zn—O oxide semiconductor such as, e.g., $InGaZnO_4$.

The capacitor intermediate layer 13c is comprised of an In—Ga—Zn—O oxide semiconductor such as, e.g., $InGaZnO_4$, and as shown in FIG. 2, is provided so that a large part of the capacitor intermediate layer 13c is exposed from the protective film 14. As shown in FIGS. 1-2, the capacitor intermediate layer 13c is conductive, and is connected to the drain electrode 15b via a contact hole 14c formed in the protective film 14.

The TFT substrate 30a having the above configuration, together with a counter substrate placed so as to face the TFT substrate 30a and a liquid crystal layer enclosed therebetween, forms an active matrix liquid crystal display panel.

A method for manufacturing the TFT substrate 30a of the present embodiment will be described with reference to FIGS. 3A-3E. FIGS. 3A-3E are diagrams corresponding to the cross-sectional view of FIG. 2, illustrating a manufacturing process of the TFT substrate 30a of the present embodiment. The manufacturing method of the present embodiment includes a first step, a second step, a third step, a fourth step, a fifth step, and a sixth step.

First, a metal film such as, e.g., a titanium film (about 2,000 Å) is formed on an entire insulating substrate 10 such as a glass substrate by a sputtering method, and then the metal film is patterned to form a gate line 11a, a gate electrode (11a), and a capacitor line 11b, as shown in FIG. 3A (the first step).

Next, for example, a silicon nitride film (thickness: about 200 nm to 500 nm), a silicon oxide film (thickness: about 20 nm to 500 nm), etc. are sequentially formed by a chemical vapor deposition (CVD) method on the entire substrate having formed thereon the gate line 11a, the gate electrode (11a), and the capacitor line 11b, thereby forming a gate insulating film 12. Moreover, an In—Ga—Zn—O oxide semiconductor film (thickness: about 200 Å to 500 Å) such as $InGaZnO_4$ is formed at room temperature by, e.g., a sputtering method or a coating method. Then, the oxide semiconductor film is patterned to form a semiconductor layer 13a and another semiconductor layer 13b as shown in FIG. 3B (the second step).

Thereafter, an inorganic insulating film such as, e.g., a silicon oxide film (thickness: about 20 nm to 500 nm) is formed by a CVD method on the entire substrate having formed thereon the semiconductor layer 13a and the another semiconductor layers 13b. The inorganic insulating film is patterned to form a protective film 14 having contact holes 14a, 14b, 14c as shown in FIG. 3C. Then, the substrate having the protective film 14 formed thereon is subjected to vacuum annealing (annealing temperature: 250° C. to 350° C., annealing time: 5 minutes to 2 hours, and chamber pressure: $10^{-3}$ Pa or less) by using an infrared heater, a diffusion furnace, etc., thereby making the another semiconductor layer 13b conductive and thus forming a capacitor intermediate layer 13c (the third step). If the annealing temperature exceeds 350° C., the glass substrate (the insulating substrate 10a) tends to break. If the annealing time is in the range of 5 minutes to 2 hours, TFT characteristics can be obtained with high reproducibility. If the chamber pressure exceeds $10^{-3}$ Pa, the oxygen concentration in the chamber increases, and oxygen defects are less likely to occur, whereby the another semiconductor layer 13b is less likely to be made conductive.

Subsequently, for example, a titanium film (about 300 Å) and an aluminum film (about 2,000 Å), a titanium film (about 300 Å) and a copper film (about 2,000 Å), or a titanium film (about 300 Å), an aluminum film (about 2,000 Å), and a titanium film (about 1,000 Å), etc. are sequentially formed by a sputtering method on the entire substrate having the capacitor intermediate layer 13c formed thereon. Then, the metal stacked layer thus formed is patterned (etched with a mixture of acetic acid, phosphoric acid, and nitric acid, and oxalic acid) to form a source line 15a, a source electrode 15aa, and a drain electrode 15b, as shown in FIG. 3D, whereby a TFT 5a and an auxiliary capacitor 6a are formed (the fourth step).

Moreover, an inorganic insulating film such as, e.g., a silicon oxide film (thickness: about 20 nm to 500 nm) is formed by, e.g., a CVD method on the entire substrate having formed thereon the TFT 5a and the auxiliary capacitor 6a. The inorganic insulating film is patterned to form an interlayer insulating film 16 having a contact hole 16a, as shown in FIG. 3E (the fifth step).

Lastly, a transparent conductive film such as, e.g., an indium tin oxide (ITO) film (thickness: about 50 nm to 200 nm) is formed by a sputtering method on the entire substrate having the interlayer insulating film 16 formed thereon. Then, the transparent conductive film is patterned to form a pixel electrode 17 as shown in FIG. 2 (the sixth step).

The TFT substrate 30a can be manufactured in this manner.

Figure 4:
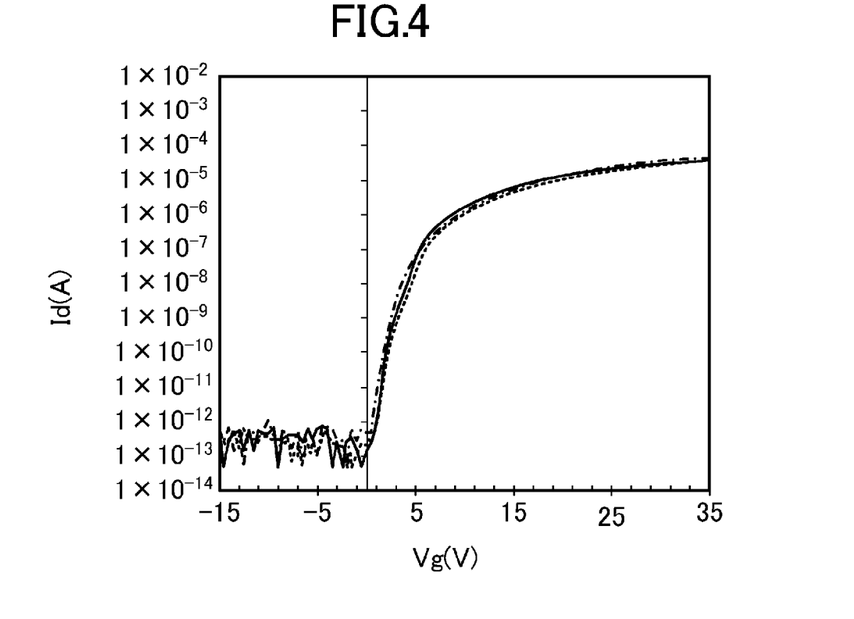
FIG. 4 is a graph showing TFT characteristics in a first experimental example.
Figure 5:
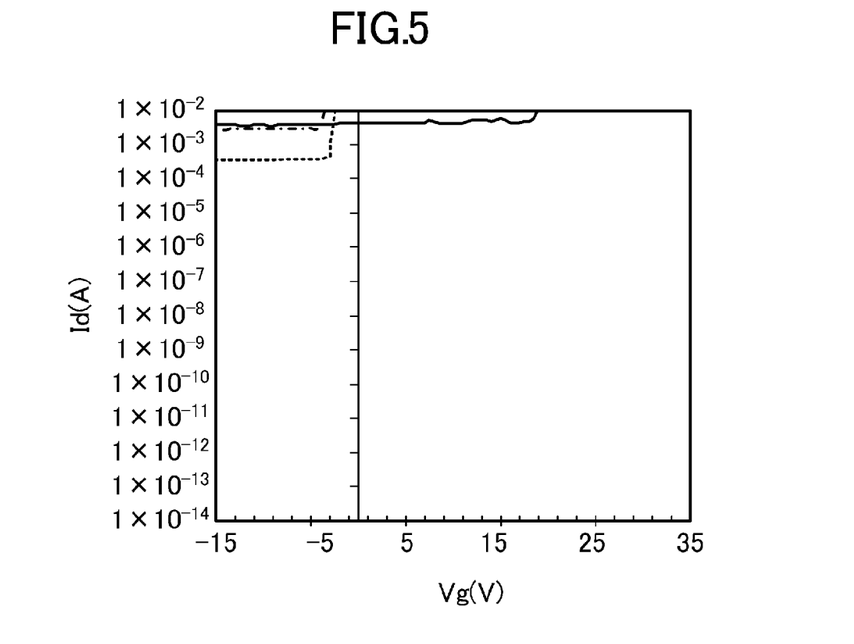
FIG. 5 is a graph showing TFT characteristics in a second experimental example.
Figure 6:
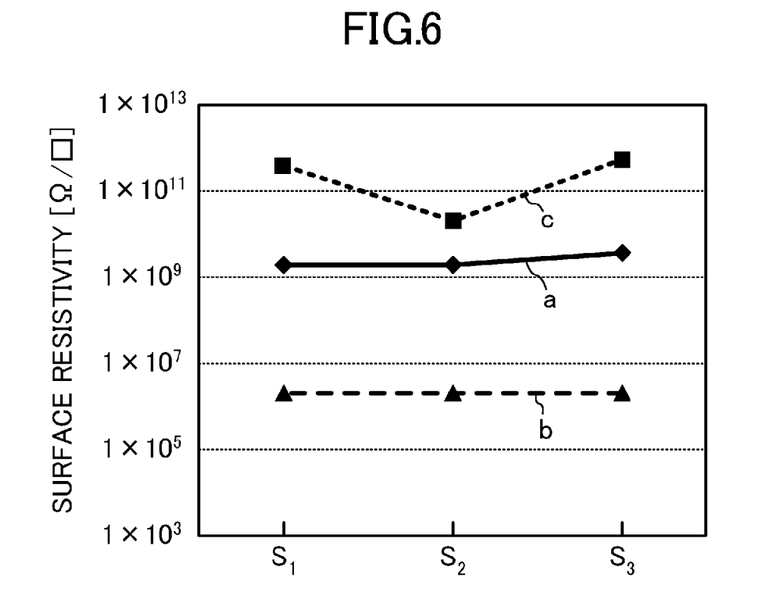
FIG. 6 is a graph showing the relation between the annealing temperature and the surface resistivity in a third experimental example.
Figure 7:
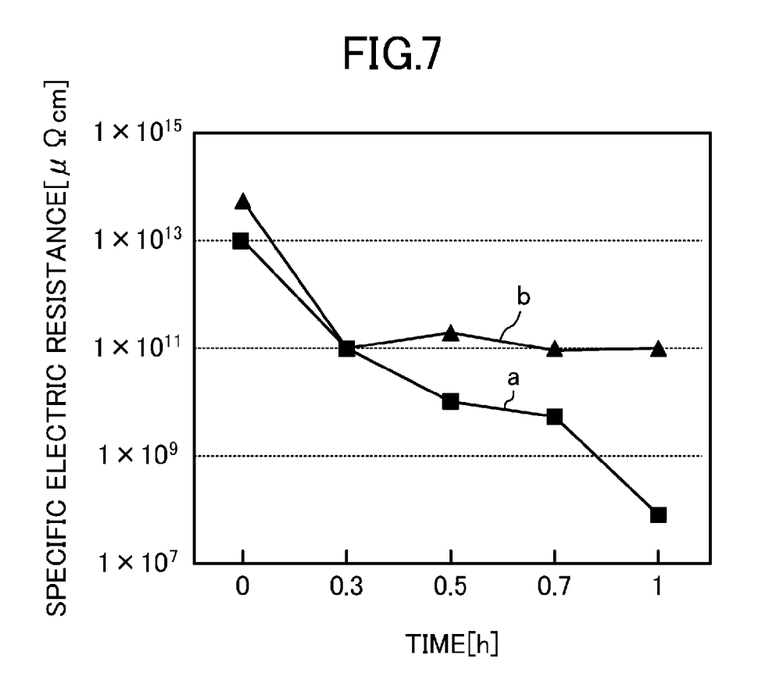
FIG. 7 is a graph showing the relation between the annealing time and the specific electric resistance in a fourth experimental example.

Specific experiments conducted will be described with reference to FIGS. 4-7. FIG. 4 is a graph showing TFT characteristics in a first experimental example, and FIG. 5 is a graph showing TFT characteristics in a second experimental example. FIG. 6 is a graph showing the relation between the annealing temperature and the surface resistivity in a third experimental example. FIG. 7 is a graph showing the relation between the annealing time and the specific electric resistance in a fourth experimental example.

First, in the first experimental example, unlike the manufacturing method of the present embodiment, a TFT substrate was prepared by performing vacuum annealing at 220° C. for 5 minutes, and TFT characteristics of the TFT substrate thus prepared were measured (see FIG. 4).

In the second experimental example, as in the manufacturing method of the present embodiment, a TFT substrate was prepared by performing vacuum annealing at 322° C. for 5 minutes, and TFT characteristics of the TFT substrate thus prepared were measured (see FIG. 5).

The results of the first and second experimental examples show that the another semiconductor layer (the capacitor intermediate layer) exhibits a semiconductor property if the vacuum annealing is performed at a low temperature of 220° C. (see FIG. 4), but the another semiconductor layer (the capacitor intermediate layer) exhibits a conductive property if the vacuum annealing is performed at an appropriate temperature of 322° C. (see FIG. 5).

Next, in the third experimental example, after a semiconductor film comprised of $InGaZnO_4$ was formed on a glass substrate, the surface resistivity was measured in an early stage before vacuum annealing (see line "a" in FIG. 6), after vacuum annealing at 220° C. for 5 minutes (see line "c" in FIG. 6), and after vacuum annealing at 330° C. for 5 minutes (see line "b" in FIG. 6) by using a measuring device (MCP-HT450 made by Mitsubishi Chemical Analytech Co., Ltd.). The "surface resistivity" ($\Omega/\square$, ohm per square) refers to the resistance per unit area, and is also called the "sheet resistance" or simply the "surface resistance." In FIG. 6, "$S_1$," "$S_2$," and "$S_3$" on the abscissa shows the difference in composition ratio of In—Ga—Zn—O of the semiconductor film.

The result of the third experimental example shows that, as shown in FIG. 6, the surface resistivity in the early stage and after the vacuum annealing at 220° C. for 5 minutes is in a range in which TFT characteristics can be obtained ($1.0 \times 10^9 \Omega/\square$ to $1.0 \times 10^{13} \Omega/\square$), and the surface resistivity after the vacuum annealing at 330° C. for 5 minutes is the surface resistivity like a conductor.

Next, in the fourth experimental example, after a semiconductor film comprised of $InGaZnO_4$ was formed on a glass substrate, vacuum annealing was performed at 220° C. (see line "a" in FIG. 7) or 350° C. (see line "b" in FIG. 7), and the specific electric resistivity was measured at various annealing times by using a measuring device (MCP-HT450 made by Mitsubishi Chemical Analytech Co., Ltd.).

The result of the fourth experimental result shows that, as shown in FIG. 7, in the case where the annealing temperature is 220° C., the specific electric resistance decreases as the annealing time increases, but in the case where the annealing temperature is 350° C., the specific electric resistance decreases as the annealing time increases, but the specific electric resistance becomes substantially constant when the annealing time exceeds 0.3 hours.

The first to fourth experimental examples confirmed that a semiconductor layer comprised of an oxide semiconductor is made conductive by performing appropriate vacuum annealing.

As described above, according to the TFT substrate 30a of the present embodiment and the manufacturing method thereof, in the second step, both the semiconductor layer 13a, which is comprised of an oxide semiconductor and has the channel region C provided so as to overlap the gate electrode (11a), and the another semiconductor layer 13b, which is provided so as to overlap the capacitor line 11b and will serve as the capacitor intermediate layer 13c, are formed on the gate insulating film 12. Then, in the third step, the another semiconductor layer 13b exposed from the protective layer 14 overlapping the channel region C is made conductive by vacuum annealing, thereby forming the capacitor intermediate layer 13c from the another semiconductor layer 13b while maintaining the semiconductor property of the semiconductor layer 13a. Thus, in each auxiliary capacitor 6a formed by the stacked structure of the capacitor line 11b, the gate insulating film 12, the capacitor intermediate layer 13c, and the drain electrode 15b, the capacitor intermediate layer 13c provided in the same layer as the semiconductor layer 13a comprised of an oxide semiconductor and forming the TFT 5a has a conductive property rather than a semiconductor property. Accordingly, the gate insulating film 12 is the only dielectric material that retains charge when a voltage is applied between the capacitor line 11b and the drain electrode 15b. Thus, electric capacitance can be stabilized ($1/C_{auxiliary\ capacitor} = 1/C_{gate\ insulating\ film}$). On the other hand, in the case where the capacitor intermediate layer is comprised of an oxide semiconductor and thus has a semiconductor property, the gate insulating film and the capacitor intermediate layer having a semiconductor property are the dielectric material that retains charge when a voltage is applied between the capacitor line and the drain electrode. Thus, the electric capacitance becomes unstable ($1/C_{auxiliary\ capacitor} = 1/C_{oxide\ semiconductor} + 1/C_{gate\ insulating\ film}$). Since the capacitor intermediate layer 13c is provided using an oxide semiconductor, but is conductive, variation in electric capacitance of the auxiliary capacitor 6a due to the semiconductor can be suppressed. Moreover, the gate insulating film 12 is the only dielectric material that retains charge when a voltage is applied between the capacitor line 11b and the drain electrode 15b. Thus, not only the electric capacitance of the auxiliary capacitor 6a can be stabilized, but also the electric capacitance of the auxiliary capacitor 6a can be increased. Moreover, since the TFT substrate 30a includes the semiconductor layer 13a comprised of an oxide semiconductor, the TFTs 5a having satisfactory characteristics such as high mobility, high reliability, and a low off-state current can be implemented.

According to the TFT substrate 30a of the present embodiment and the manufacturing method thereof, the protective film 14 is provided on the channel region C of the semiconductor layer 13a, and a large part of the capacitor intermediate layer 13c is exposed from the protective film 14. Accordingly, even if vacuum annealing is performed on the substrate to make the capacitor intermediate layer 13c provided using an oxide semiconductor conductive, the channel region C of the semiconductor layer 13a is not made conductive, and the semiconductor property of the channel region C can be maintained.

Second Embodiment of Invention

Figure 8:
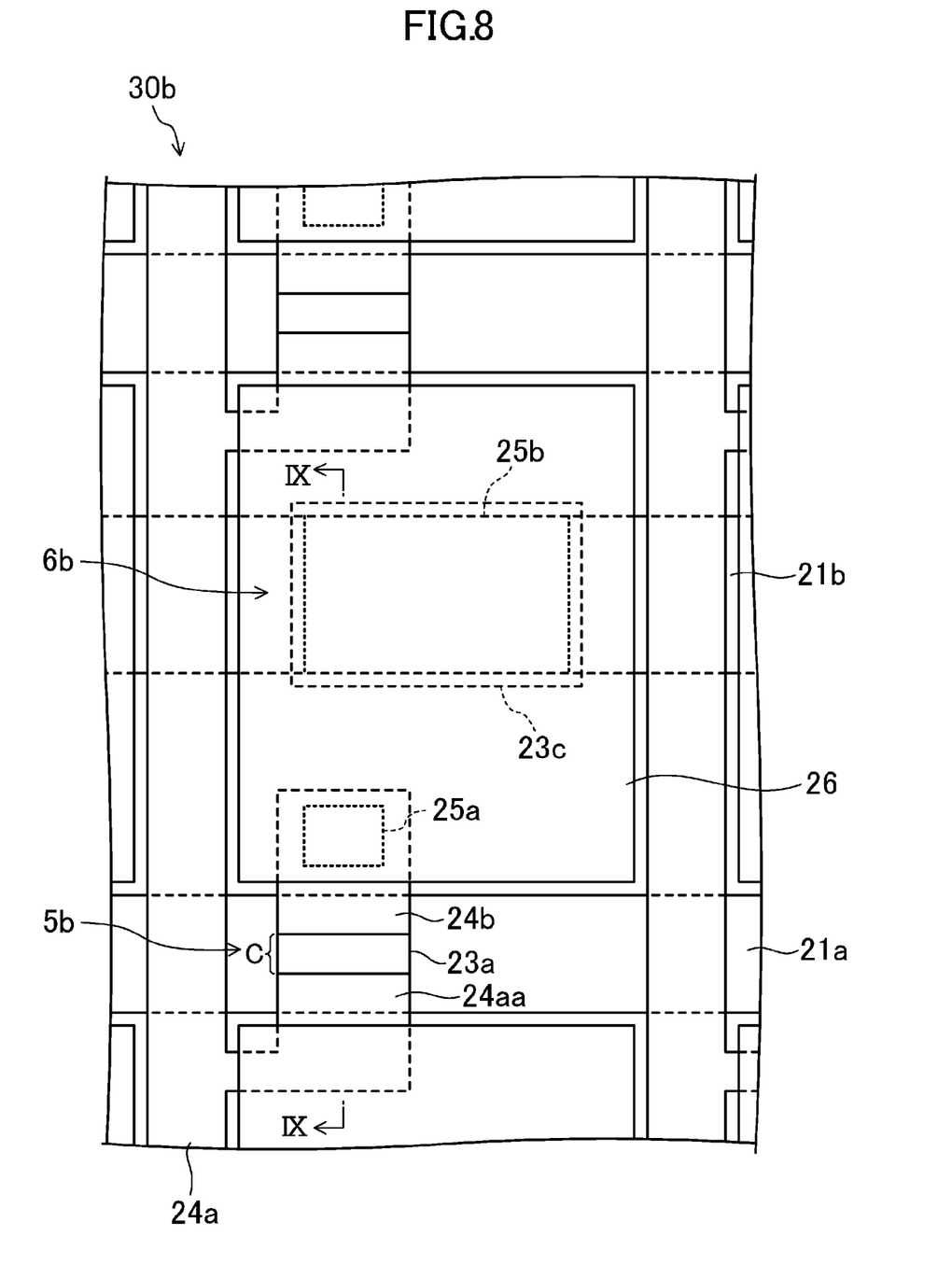
FIG. 8 is a plan view of a TFT substrate according to a second embodiment.
Figure 9:
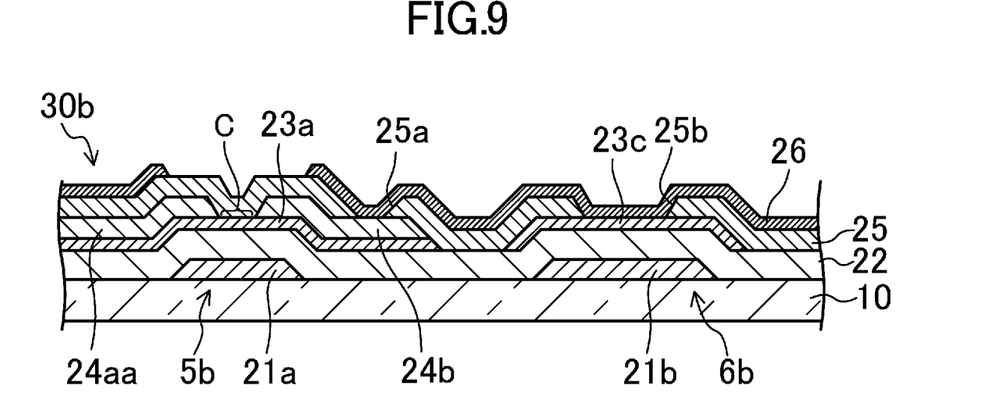
FIG. 9 is a cross-sectional view of the TFT substrate taken along line IX-IX in FIG. 8.
Figure 10:
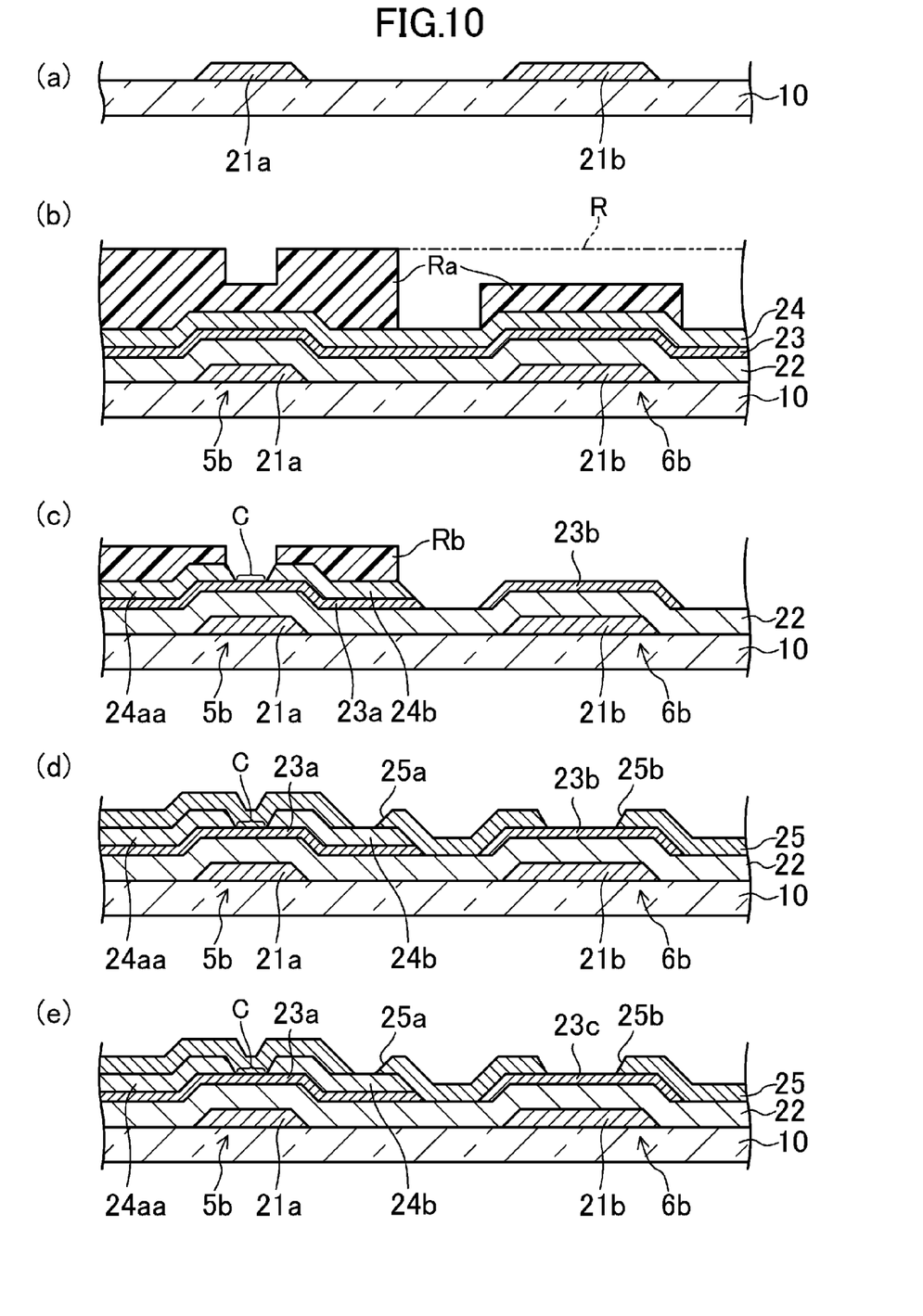
FIGS. 10A-10E are diagrams illustrating in cross section a manufacturing process of the TFT substrate according to the second embodiment.

FIGS. 8-10 show a second embodiment of a TFT substrate and a manufacturing method thereof according to the present invention. Specifically, FIG. 8 is a plan view of a TFT substrate 30b of the present embodiment, and FIG. 9 is a cross-sectional view of the TFT substrate 30b taken along line IX-IX in FIG. 8. In the following embodiment, the same portions as those of FIGS. 1-7 are denoted with the same reference characters, and detailed description thereof will be omitted.

The first embodiment is described with respect to the TFT substrate 30a in which a capacitor electrode forming the auxiliary capacitor is a part of the drain electrode, and the manufacturing method of the TFT substrate 30a. The present embodiment is described with respect to a TFT substrate 30b in which the capacitor electrode is a part of the pixel electrode, and a manufacturing method of the TFT substrate 30b (using four masks).

As shown in FIGS. 8-9, the TFT substrate 30b includes: an insulating substrate 10; a plurality of gate lines 21a provided on the insulating substrate 10 so as to extend parallel to each other; a plurality of capacitor lines 21b each provided between adjoining ones of the gate lines 21a and arranged so as to extend parallel to each other; a plurality of source lines 24a provided so as to extend parallel to each other in a direction perpendicular to the gate lines 21a; a plurality of TFTs 5b provided at every intersection of the gate line 21a and the source line 24a, i.e., in every pixel as a minimum unit of an image; an interlayer insulating film 25 provided so as to cover the TFTs 5b; a plurality of pixel electrodes 26 provided in a matrix pattern on the interlayer insulating film 25; and an alignment film (not shown) provided so as to cover the pixel electrodes 26.

As shown in FIGS. 8-9, the TFT 5b includes a gate electrode (21a) provided on the insulating substrate 10, a gate insolating film 22 provided so as to cover the gate electrode (21a), a semiconductor layer 23a provided on the gate insulating film 22 and having the channel region C placed therein so as to overlap the gate electrode (21a), and a source electrode 24aa and a drain electrode 24b which are provided on the semiconductor layer 23a and placed so as to be separated from each other with the channel region C interposed therebetween.

As shown in FIG. 8, the gate electrode (21a) is a part of the gate line 21a.

As shown in FIG. 8, the source electrode 24aa is a portion of the source line 24a which protrudes in the lateral direction so as to form an L-shape.

As shown in FIGS. 8-9, the drain electrode 24b is connected to the pixel electrode 26 via a contact hole 25a formed in the interlayer insulating film 25. As shown in FIGS. 8-9, the pixel electrode 26 overlaps the capacitor line 21b with both the gate insulating film 22 and a capacitor intermediate layer 23c interposed therebetween, thereby forming an auxiliary capacitor 6b.

The semiconductor layer 23a is comprised of an In—Ga—Zn—O oxide semiconductor such as, e.g., InGaZnO$_4$.

The capacitor intermediate layer 23c is comprised of an In—Ga—Zn—O oxide semiconductor such as, e.g., InGaZnO$_4$, and as shown in FIG. 9, is provided so that a large part of the capacitor intermediate layer 23c is exposed from the interlayer insulating film 25. As shown in FIGS. 8-9, the capacitor intermediate layer 23c is conductive, and is connected to the pixel electrode 26 via a contact hole 25b formed in the interlayer insulating film 25.

The TFT substrate 30b having the above configuration, together with a counter substrate placed so as to face the TFT substrate 30b and a liquid crystal layer enclosed therebetween, forms an active matrix liquid crystal display panel.

A method for manufacturing the TFT substrate 30b of the present embodiment will be described with reference to FIGS. 10A-10E. FIGS. 10A-10E are diagrams corresponding to the cross-sectional view of FIG. 9, illustrating a manufacturing process of the TFT substrate 30b of the present embodiment. The manufacturing method of the present embodiment includes a first step, a second step, a third step, and a fourth step.

First, a metal film such as, e.g., a titanium film (about 2,000 Å) is formed on an entire insulating substrate 10 such as a glass substrate by a sputtering method, and then the metal film is patterned by using photolithography to form a gate line 21a, a gate electrode (21a), and a capacitor line 21b, as shown in FIG. 10A (the first step).

Next, for example, a silicon nitride film (thickness: about 200 nm to 500 nm), a silicon oxide film (thickness: about 20 nm to 500 nm), etc. are sequentially formed by a CVD method on the entire substrate having formed thereon the gate line 21a, the gate electrode (21a), and the capacitor line 21b, thereby forming a gate insulating film 22 (see FIG. 10B). Thereafter, an In—Ga—Zn—O oxide semiconductor film such as InGaZnO$_4$ (thickness: about 200 Å to 500 Å) is formed at room temperature by, e.g., a sputtering method or a coating method to form an oxide semiconductor film 23 (see FIG. 10B). Moreover, for example, a titanium film (about 300 Å) and an aluminum film (about 2,000 Å), a titanium film (about 300 Å) and a copper film (about 2,000 Å), or a titanium film (about 300 Å), an aluminum film (about 2,000 Å), and a titanium film (about 1,000 Å), etc. are sequentially formed by a sputtering method to form a source metal film 24 (see FIG. 10B). Then, a photosensitive resin film R is applied to the source metal film 24, and the photosensitive resin film R thus applied is exposed via a halftone or gray-tone photomask capable of providing halftone exposure, and then is developed to form a resist pattern Ra in which a portion corresponding to a source line 24a, a source electrode 24aa, and a drain electrode 24b is relatively thick and a portion corresponding to a channel region C and a capacitor intermediate layer 23c is relatively thin, as shown in FIG. 10B. Thereafter, the source metal film 24 exposed from the resist pattern Ra and the oxide semiconductor film 23 formed below the source metal film 24 are etched, and the resist pattern Ra is thinned by ashing etc. to remove the relatively thin portion of the resist pattern Ra, whereby a resist pattern Rb (see FIG. 10C) is formed. Then, the source metal film 24 exposed from the resist pattern Rb is etched to form a semiconductor layer 23a, the source line 24a, the source electrode 24aa and the drain electrode 24b, and another semiconductor layer 23b that will serve as the capacitor intermediate layer 23c, as shown in FIG. 10C (the second step).

Thereafter, an inorganic insulating film such as, e.g., a silicon oxide film (thickness: about 20 nm to 500 nm) is formed by a CVD method on the entire substrate having formed thereon the semiconductor layer 23a, the source line 24a, the source electrode 24aa, the drain electrode 24b, and the another semiconductor layer 23b. The inorganic insulating film is patterned by using photolithography to form an interlayer insulating film 25 having contact holes 25a, 25b as shown in FIG. 10D. Then, the substrate having the interlayer insulating film 25 formed thereon is subjected to vacuum annealing by using an infrared heater, a diffusion furnace, etc., thereby making the another semiconductor layer 23b conductive and thus forming the capacitor intermediate layer 23c as shown in FIG. 10E (the third step).

Lastly, a transparent conductive film such as, e.g., an ITO film (thickness: about 50 nm to 200 nm) is formed by a sputtering method on the entire substrate having the capacitor intermediate layer 23c formed thereon. Then, the transparent conductive film is patterned by using photolithography to form a pixel electrode 26 as shown in FIG. 9 (the fourth step).

The TFT substrate 30b can be manufactured in this manner.

As described above, according to the TFT substrate 30b of the present embodiment and the manufacturing method thereof, in the second step, both the semiconductor layer 23a, which is comprised of an oxide semiconductor and has the channel region C provided so as to overlap the gate electrode (21a), and the another semiconductor layer 23b, which is provided so as to overlap the capacitor line 21b and will serve as the capacitor intermediate layer 23c, are formed on the gate insulating film 22. Then, in the third step, the another semiconductor layer 23b exposed from the interlayer insulating film 25 overlapping the channel region C is made conductive by vacuum annealing, thereby forming the capacitor intermediate layer 23c from the another semiconductor layer 23b while maintaining the semiconductor property of the semiconductor layer 23a. Thus, in each auxiliary capacitor 6b formed by the stacked structure of the capacitor line 21b, the gate insulating film 22, the capacitor intermediate layer 23c, and the pixel electrode 26, the capacitor intermediate layer 23c provided in the same layer as the semiconductor layer 23a comprised of an oxide semiconductor and forming the TFT 5a has a conductive property rather than a semiconductor property. Accordingly, the gate insulating film 22 is the only dielectric material that retains charge when a voltage is applied between the capacitor line 21b and the pixel electrode 26. Thus, electric capacitance can be stabilized ($1/C_{auxiliary\ capacitor} = 1/C_{gate\ insulating\ film}$). On the other hand, in the case where the capacitor intermediate layer is comprised of an oxide semiconductor and thus has a semiconductor property, the gate insulating film and the capacitor intermediate layer having a semiconductor property are the dielectric material that retains charge when a voltage is applied between the capacitor line and the pixel electrode. Thus, the electric capacitance becomes unstable ($1/C_{auxiliary\ capacitor}=1/C_{oxide\ semiconductor}+1/C_{gate\ insulating\ film}$). Since the capacitor intermediate layer 23c is provided using an oxide semiconductor, but is conductive, variation in electric capacitance of the auxiliary capacitor 6b due to the semiconductor can be suppressed. Moreover, the gate insulating film 22 is the only dielectric material that retains charge when a voltage is applied between the capacitor line 21b and the pixel electrode 26. Thus, not only the electric capacitance of the auxiliary capacitor 6b can be stabilized, but also the electric capacitance of the auxiliary capacitor 6b can be increased. Moreover, since the TFT substrate 30b can be manufactured by using a total of four photomasks, namely a photomask used in the first step, the photomask capable of providing halftone exposure and used in the second step, a photomask used in the third step, and a photomask used in the fourth step, manufacturing cost of the TFT substrate 30b can be reduced. Since the TFT substrate 30b includes the semiconductor layer 23a comprised of an oxide semiconductor, the TFTs 5b having satisfactory characteristics such as high mobility, high reliability, and a low off-state current can be implemented.

According to the TFT substrate 30b of the present embodiment and the manufacturing method thereof, the interlayer insulating film 25 is provided on each TFT 5b, and a large part of the capacitor intermediate layer 23c is exposed from the interlayer insulating film 25. Accordingly, even if vacuum annealing is performed on the substrate to make the capacitor intermediate layer 23c provided using an oxide semiconductor conductive, the semiconductor layer 23a forming the TFT 5b is not made conductive, and the semiconductor property of the semiconductor layer 23a can be maintained.

Although the In—Ga—Zn—O oxide semiconductor layer is described in the above embodiments, the present invention is also applicable to, e.g., In—Si—Zn—O, In—Al—Zn—O, Sn—Si—Zn—O, Sn—Al—Zn—O, Sn—Ga—Zn—O, Ga—Si—Zn—O, Ga—Al—Zn—O, In—Cu—Zn—O, Sn—Cu—Zn—O, Zn—O, In—O, and In—Zn—O oxide semiconductor layers etc.

Although the gate line (the gate electrode) and the capacitor line have a single layer structure in the above embodiments, the gate line (the gate electrode) and the capacitor line may have a stacked structure.

Although the source line, the source electrode, and the drain electrode have a stacked structure in the above embodiments, the source line, the source electrode, and the drain electrode may have a single layer structure.

Although the gate insulating film has a stacked structure in the above embodiments, the gate insulating film may have a single layer structure.

Although the protective film and the interlayer insulating film have a single layer structure in the above embodiments, the protective layer and the interlayer insulating film may have a stacked structure.

Although each of the above embodiments is described with respect to the TFT substrate in which the drain electrode is an electrode of the TFT which is connected to the pixel electrode, the present invention is also applicable to a TFT substrate in which the source electrode is an electrode of the TFT which is connected to the pixel electrode.

INDUSTRIAL APPLICABILITY

As described above, the present invention can suppress variation in electric capacitance of the auxiliary capacitor due to semiconductor. Accordingly, the present invention is useful for TFT substrates forming liquid crystal display panels.

DESCRIPTION OF REFERENCE CHARACTERS

C Channel Region
R Resist pattern
5a, 5b TFT
6a, 6b Auxiliary Capacitor
10 Insulating Substrate
11a, 21a Gate Line (Gate Electrode)
11b, 21b Capacitor Line
12, 22 Gate Insulating Film
13a, 23a Semiconductor Layer
13b, 23b Another Semiconductor Layer
13c, 23c Capacitor Intermediate Layer
14 Protective Film
15aa, 24aa Source Electrode
15b, 24b Drain Electrode (Capacitor Electrode)
17 Pixel Electrode
23 Oxide Semiconductor Film
24 Source Metal Film
25 Interlayer Insulating Film
25b Contact Hole
26 Pixel Electrode (Capacitor Electrode)
30a, 30b TFT substrate

The invention claimed is:

1. A method for manufacturing a thin film transistor substrate including a plurality of pixel electrodes arranged in a matrix pattern, a plurality of thin film transistors respectively provided for the pixels electrodes and respectively connected to the pixel electrodes, and a plurality of auxiliary capacitors respectively provided for the pixel electrodes, wherein each of the thin film transistors includes a gate electrode provided on a substrate, a gate insulating film provided so as to cover the gate electrode, a semiconductor layer comprised of an oxide semiconductor and having a channel region provided on the gate insulating film so as to overlap the gate electrode, and a source electrode and a drain electrode which are provided on the semiconductor layer so as to be separated from each other with the channel region interposed therebetween, each of the auxiliary capacitors includes a capacitor line comprised of a same material as the gate electrode and provided in a same layer as the gate electrode, the gate insulating film provided so as to cover the capacitor line, a capacitor intermediate layer provided using the oxide semiconductor and provided on the gate insulating film so as to overlap the capacitor line, and a capacitor electrode provided on the capacitor intermediate layer, the method comprising:

a first step of forming the gate electrode and the capacitor line on the substrate;

a second step of sequentially forming the gate insulating film, an oxide semiconductor film, and a source metal film so as to cover the gate electrode and the capacitor line, then forming on the source metal film a resist pattern in which a portion corresponding to the source electrode and the drain electrode is relatively thick and a portion corresponding to the channel region and the capacitor intermediate layer is relatively thin, and subsequently, etching the source metal film exposed from the resist pattern and the oxide semiconductor film, and then thinning the resist pattern to remove the relatively thin portion, and etching the source metal film thus exposed, thereby forming the semiconductor layer, the source electrode and the drain electrode, and another semiconductor layer that serves as the capacitor intermediate layer;

a third step of forming an interlayer insulating film so as to overlap the channel region of the semiconductor layer and to expose a part of the drain electrode and the another semiconductor layer, and then making the another semiconductor layer exposed from the interlayer insulating film conductive by vacuum annealing, thereby forming the capacitor intermediate layer; and a fourth step of forming on the interlayer insulating film the pixel electrode that functions as the capacitor electrode.

2. The method of claim 1, wherein the oxide semiconductor is an In—Ga—Zn—O oxide semiconductor layer.

3. The method of claim 1, wherein in the second step, a silicon nitride film and a silicon oxide film are sequentially formed to cover the gate electrode and the capacitor line, thereby forming the gate insulating film.

4. The method of claim 1, wherein in the second step, the oxide semiconductor film is formed by a sputtering method or a coating method.

5. The method of claim 1, wherein in the second step, a titanium film and an aluminum film, a titanium film and a copper film, or a titanium film, an aluminum film, and a titanium film are sequentially formed to cover the oxide semiconductor, thereby forming the metal film.

6. The method of claim 1, wherein the interlayer insulating film is a silicon oxide film.

\* \* \* \* \*